United States Patent [19]

Jund

[11] 3,761,784

[45] Sept. 25, 1973

[54] SEMI-CONDUCTOR STRAIN GAUGE DEVICE WITH FIELD EFFECT TRANSISTOR SYMMETRICAL PAIRS

[75] Inventor: Christian Jund, Paris, France

[73] Assignee: Sescosem-Societe Europeenne de Semiconducteurs et de Microelectronique, Paris, France

[22] Filed: June 13, 1972

[21] Appl. No.: 262,336

[30] Foreign Application Priority Data

June 29, 1971 France .............................. 7123627

[52] U.S. Cl. .... 317/235 R, 317/235 M, 317/234 R, 307/304, 307/310, 73/88.5

[51] Int. Cl. ......................... H01l 11/00, H01l 15/00

[58] Field of Search ...................... 317/234, 26, 235; 307/288, 304, 310; 73/88.5

[56] References Cited

UNITED STATES PATENTS

| | | | |
|---|---|---|---|
| 3,416,008 | 12/1968 | Memelink et al. | 307/288 X |
| 3,492,861 | 2/1970 | Jund | 317/234 X |
| 3,609,252 | 9/1971 | Broce | 317/235 X |
| 3,628,070 | 12/1971 | Heuner et al. | 307/288 X |

*Primary Examiner*—John W. Huckert
*Assistant Examiner*—Andrew J. James
*Attorney*—John W. Malley et al.

[57] ABSTRACT

Strain gauge comprising two pairs of field effect transistors integrated into the same substrate, and occupying positions disposed in symmetrical pairs vis-a-vis a substrate point, the channels of two symmetrical transistors being parallel with one another.

7 Claims, 5 Drawing Figures

SEMI-CONDUCTOR STRAIN GAUGE DEVICE WITH FIELD EFFECT TRANSISTOR SYMMETRICAL PAIRS

The invention relates to mechanical strain gauges, using field-effect transistors integrated into a substrate, which is subjected to mechanical stresses, and connected in such a fashion that, as a consequence of the variations in electrical characteristics resulting from such stresses, an electrical stress-measurement device is created, which is known as a transistorised strain gauge.

A gauge of this kind which is highly sensitive is known, in which two field-effect transistors, integrated within the same substrate, are connected in series, one of the transistors operating as load vis-a-vis the other, and the two being geometrically arranged so that one of them has a gauge factor whose sign is the opposite of that of the other ; to this end, the major surfaces of the substrate containing a 1-0-0 crystallographic axis, the two transistors are arranged so that the source-drain current of one of them flows along this axis, and the source-drain current of the other, flows perpendicularly to this axis.

This kind of transducer only operates properly if the two field-effect transistors have matched electrical characteristics when the substrate is unstressed. However, this condition is not achieved accurately in the case of two transistors formed in two portions, albeit close together, from a semiconductor wafer.

For achieving the same electrical characteristics, the transistors must have the same geometrical dimensions, particularly at the place of the channel diffused zones, and the same electric charge carrier mobilities. It is therefore highly desirable to arrange .......... each transistor so that its current flows along the same crystallographic orientation ; this is possible in using, for example in the silicon case, the "100" axis in a "100" oriented flat crystal substrate.

But, whatever the care may be taken during the semiconductor processing, the impurities concentrations governing the conduction characteristics vary between two different points, according to an approximately linear variation law.

The invention overcomes this drawback, by using two strain gauges as described above, connected in parallel. The resulting strain gauge thus comprises four transistors integrated within one and the same monocrystalline semi-conductor substrate. The four transistors are located at the corners of a rhombus, at least one diagonal of which represents a crystallographic axis, for example the "100" or the "010" axis, which are equivalent from electrical conductivity point of view.

The source — drain currents through the two transistors arranged at the ends of a first diagonal, flow in parallel through the second diagonal, and this condition applies vice-versa in respect of the second diagonal.

The invention will be better understood from a consideration of the ensuing description and attached drawings in which.

Figure 1:
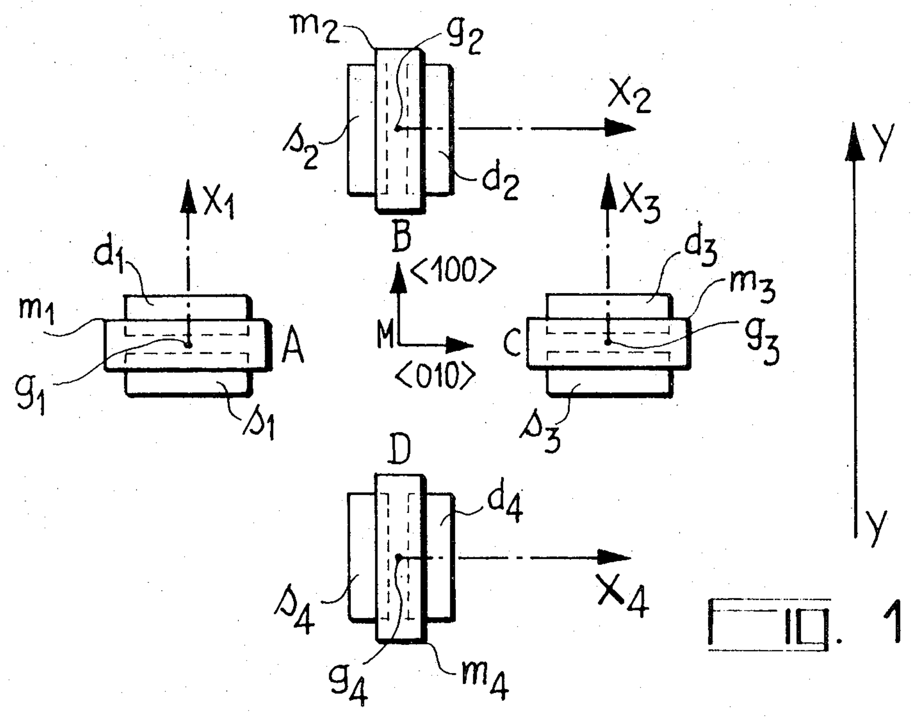
FIG. 1 is a diagram illustrating the transistor orientation on the substrate.

FIG. 1 shows, in accordance with the principle of the invention, the arrangement of four transistors, ABCD of field-effect type. They are arranged in a cross pattern, the centres of the gates *g*1, *g*2, *g*3, *g*4 being located at the corners of a rhombus (approximately a square in the case shown in FIG. 1). The metallised areas, representing the gates (*m*1, *m*2, *m*3, and *m*4) and extending above the source and drain regions *s*1, *s*2, *s*3 and *s*4, and *d*1, *d*2 , *d*3 and *d*4, from which they are separated by an insulating layer not shown, have been indicated schematically ; likewise the source and drain contacts have not been shown. As they are illustrated, the transistors A B C D are of the MOS kind, with the gate insulated from the substrate. The principle of the invention, however, is applicable to field-effect transistors comprising a junction, that is to say ones in which the control electrode is in contact with the channel through the medium of a zone of opposite conductivity type to that of the channel.

The axes X1, X2, X3 and X4 illustrate the directions of the currents flowing from the source to the drain in each of the transistors A, B, C and D. In the case in accordance with the invention, the axes X1 and X3 are parallel to the crystal axis "1–0–0" , the axes X2 and X4 being perpendicular to this axis, that is to say parallel to the "0–1–0" axis for example, which has been already mentioned above, as equivalent to the other, from conduction point of view.

The principle of the invention is equally applicable to the case in which the vectors X1 and X3 on the one hand, and those X2 and X4, on the other, are derived from one another not by a translational movement *g*1, *g*3 or *g*2, *g*4, but by a symmetrical disposition in relation to the point M which is the centre of the rhombus.

The axis along which a mechanical stress is applied, is illustrated in FIG. 1 by the axis YY which is parallel to "1–0–0."

Figure 2:
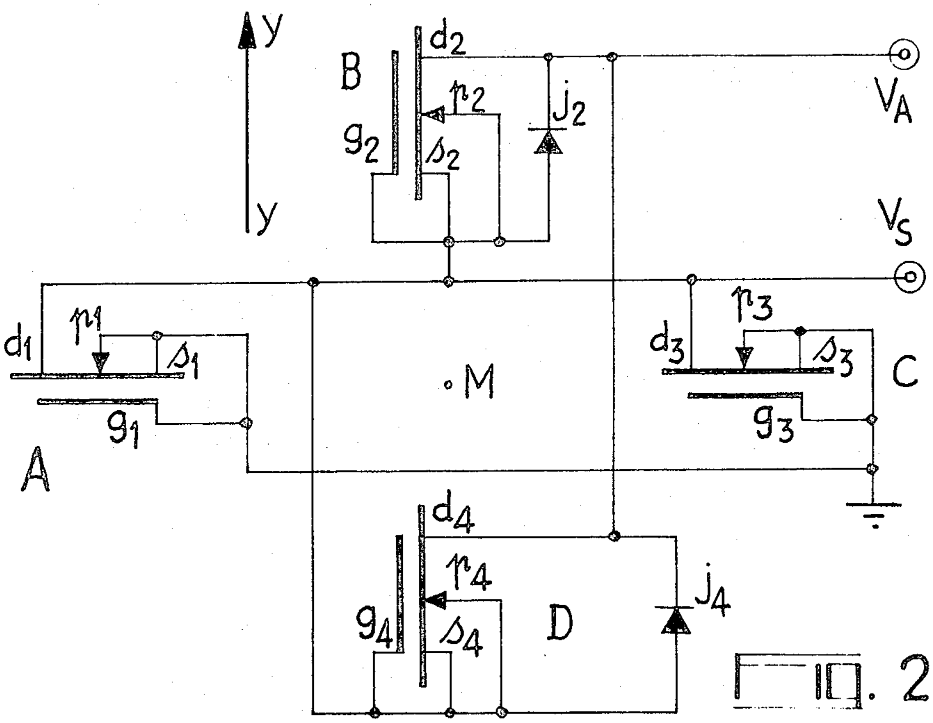
FIGS. 2 and 3 are equivalent circuit diagram relating to a system comprising four MOS (metal-oxide-semiconductor) transistors, in accordance with two embodiments of the invention.

FIG. 2 shows the circuit connecting MOS transistors A, B, C and D arranged in the manner shown in FIG. 1, which their sources *s*1 to *s*4, their gates *g*1 to *g*4, their drains *d*1 to *d*4, and the contacts *p*1 to *p*4 with the substrate.

The connections are so disposed that the transistors A and B on the one hand, and those C and D on the other, are connected in series, the drains of A and C being respectively connected to the sources of B and D and also to an output terminal $V_S$. In the case of each transistor, the gate and the substrate are connected to the source. The drains d2 and d4 are connected to a d.c. supply terminal $V_A$.

In operation, the transistors A and C constitute the active elements in each of the structures employed in the system. The transistors B and D will, by contrast, act as passive elements in this arrangement , their gauge factors being smaller than those of the transistor A and C, and of opposite sign.

The two structures being connected in parallel with the respective terminals "earth" $V_S$ and $V_A$, the measurement carried out across these three terminals will be a resultant of the combined action of the transistors of each structure and will correspond with the mean characteristics of the transistors considered in pairs symetrically in relation to the centre M of the device.

Figure 3:
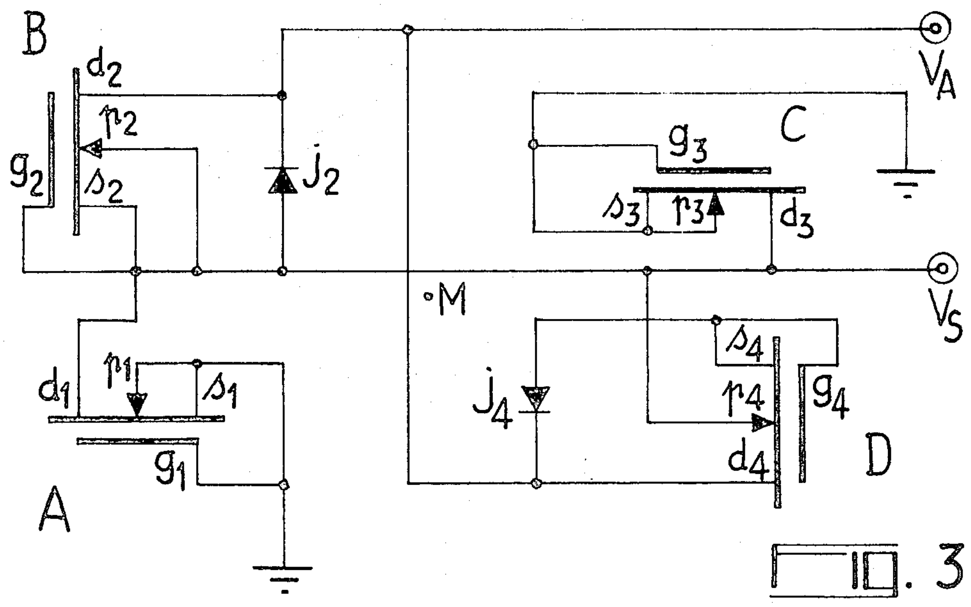

FIG. 3 illustrates a variant embodiment of the invention. In this case, the transistors A and C, on the one hand, and those B and D on the other, are symmetrically arranged in relation to one another, vis-a-vis the centre M of the device.

Figure 4:
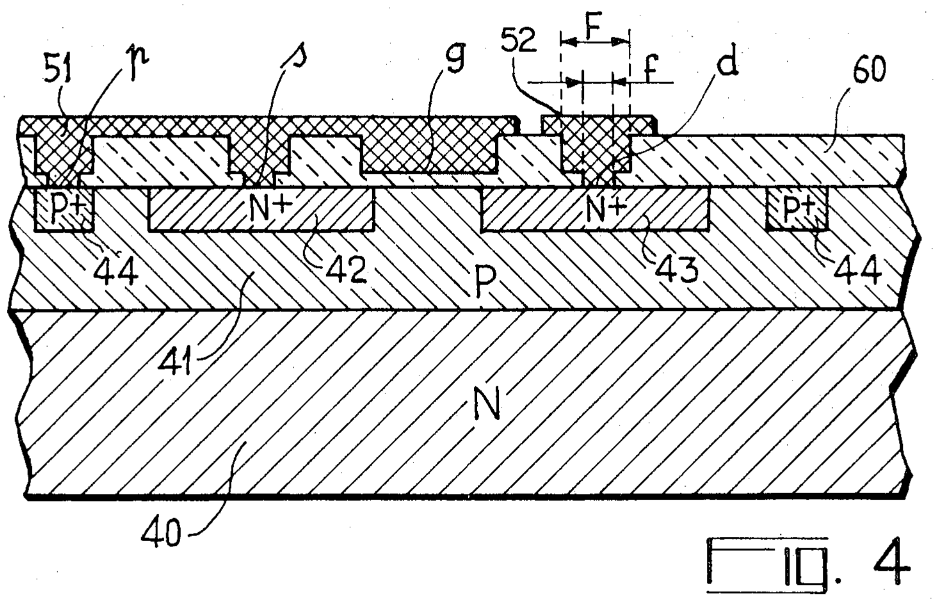
FIG. 4 is a section through a MOS transistor comprising an insulating ring, included in an integrated circuit in accordance with the invention.

In FIG. 4, the transverse section through a transistor A, (or C) has been illustrated by way of an example of the method of integration of the transistors A, B, C or D. On an N-doped substrate 40, there has been epitaxially deposited a P-doped layer 41. In the layer 41, there have been diffused through windows (not shown) opened in an oxide layer , $N^+$ doped zones 42 and 43 and a $P^+$ doped ring 44. There has then been formed a new oxide layer 60 in which openings of size F have been etched which go down no further than the layer 41, following which, at the centre of certain windows, openings of size f have been produced giving access to the surface of the semi-conductor material. These are windows located at the centre of the zones 42 and 43 and a point in a ring 44 (window p). By contrast, in the gate zone g , a small oxide layer has been left. Subsequently, contacts 51 and 52 have been deposited. The contact 51, in window p, links the source electrode (zone 42), and the gate electrode in the window g. The contact 52 is designed to connect an output terminal of the drain electrode (zone 43), and the source of the load element B (or D).

Figure 5:
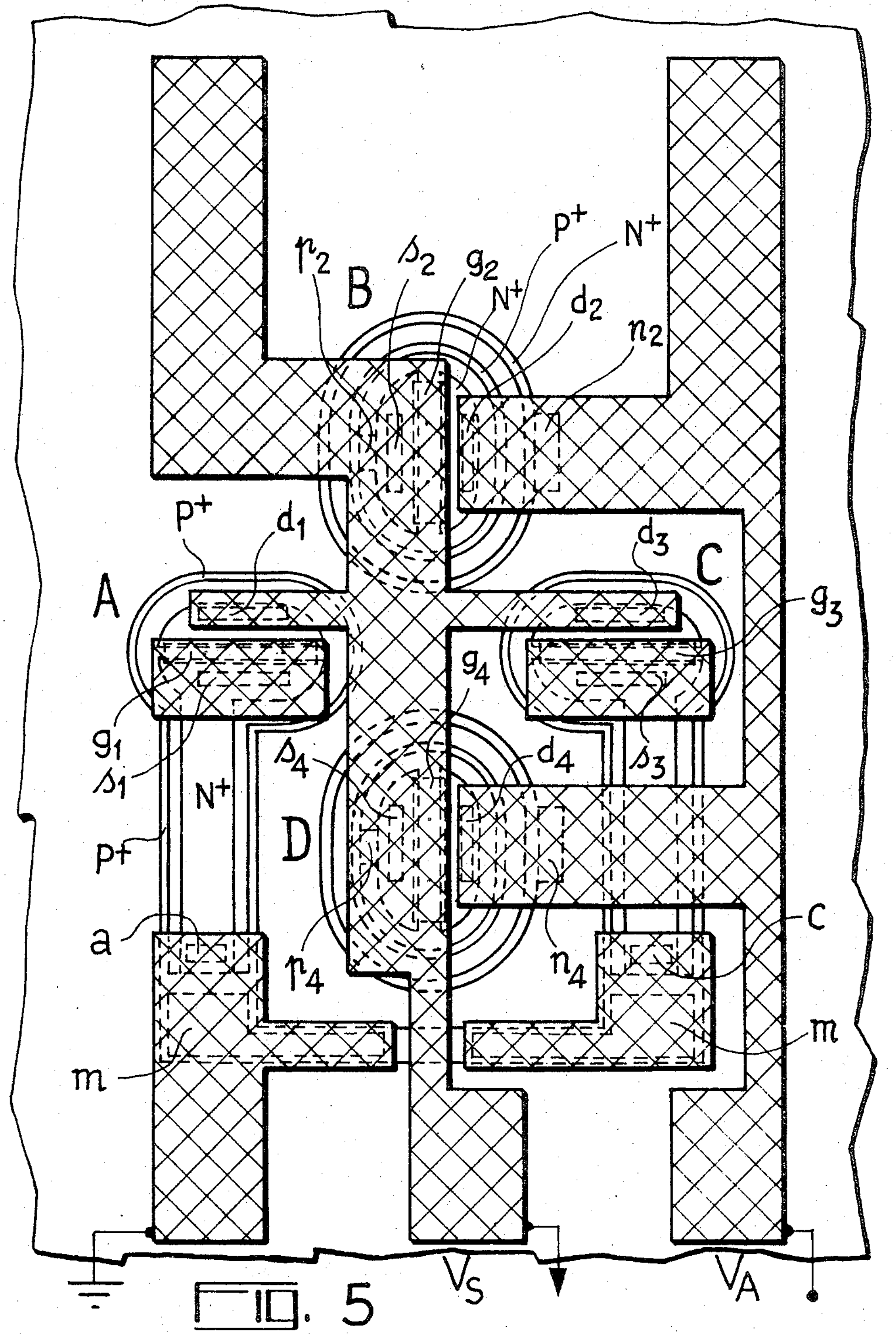
FIG. 5 is a plan view of an integrated circuit in accordance with an embodiment of the invention.

FIG. 5 is an example of the integration of the circuit in accordance with the arrangement shown in FIG. 2, insulating rings similar to that of FIG. 4 being produced. However, the N+ rings surrounding the zones in which the transistors B and D are implanted, are connected by contacts n2 and n4 to the terminal $V_A$.

Similarly, in the case of the transistors B and D, unlike FIG. 4, the P+ rings are connected by contacts *p*2 and *p*4 to the terminal $V_S$.

A special feature of the integrated circuit shown in FIG. 5 resides in the fact that crossed connections have been used. This applies on the one hand to the connection *d*4—$V_A$ which is constituted by a metallised area extending above the oxide layer, and on the other hand to the connection *s*3- which links the metallised areas (s3, g2) and the metallised area (c, m) for the heavily N+-doped layer extending beneath the oxide layer.

For reasons of symmetry, the connection "*s*1-*a*" connecting the source of the transistor A with the earth n of the substrate, is produced in the same manner as for the transistor C.

The invention is applicable to stress measurement devices either of MOS kind or junction field-effect transistor kind, in the context of semiconductor transducers and in particular record pick-up heads.

Of course, the invention is not limited to the embodiments described and shown which was given solely by way of example.

What is claimed is:

1. A strain guage device for measurement of mechanical stresses comprising: on a large face of a monocrystalline semi-conductor substrate, four integrated field effect transistors, respectively located at the four corners of a rhombus, having two diagonals the two transistors located at the ends of one diagonal, having their channel parallel to the other diagonal, and vice-versa, each of said two transistors having a load constituted respectively by one of the two other transistors located at the ends of said other diagonal, and having respectively their source terminals and their drain terminals connected together, said source and drain terminal exhibiting a potential difference for said measurement when said mechanical stresses are applied in a direction contained in said large face of the monocrystalline semiconductor substrate.

2. A device as claimed in claim 1, wherein two transistors located at the ends of a diagonal, are derived from one another by translation.

3. A device as claimed in claim 1, wherein two transistors located at the ends of a diagonal are derived from one another by their symmetry in relation to a point.

4. A device as claimed in claim 1 wherein said two transistors have their source-drain current flowing parallel to the axis along which the mechanical stresses are applied, the gate and substrate of each of said four transistors being connected to their respective sources, the sources of said two transistors being, earthed, and their drains being connected on the one hand to the output terminal for said measurement, and on the other hand to the respective sources of said two other transistors the drains of these two other transistors being connected to one terminal of the d.c. supply source.

5. A device as claimed in claim 4, wherein the implanted zones in a semiconductor layer of a first conductivity type, belonging to said two other transistors, are insulated from the implanted zones of said two transistors, by means of a ring-shaped zone heavily doped to produce a conductivity type opposite to the first mentioned conductivity type, said ring being at the potential of the drains of said two other transistors.

6. A device as claimed in claim 5, wherein each implanted zone in the transistors, is surrounded by a ring heavily doped to produce the first conductivity type, connected to said implanted layer for said two other transistors and to the substrate for said two transistors, said ring being located inside said ring-shaped zone.

7. A device as claimed in claim 6, wherein an insulated cross-connection is produced between on the one hand a metallised area linking a transistor electrode to a circuit terminal, and on the other hand a heavity doped layer forming an electrode extension and belonging beneath the oxide layer which is used to carry the metallised area.

* * * * *